US008736357B2

(12) United States Patent
Nadimpalli et al.

(10) Patent No.: US 8,736,357 B2
(45) Date of Patent: May 27, 2014

(54) METHOD OF GENERATING MULTIPLE CURRENT SOURCES FROM A SINGLE REFERENCE RESISTOR

(71) Applicant: RF Micro Devices, Inc., Greensboro, NC (US)

(72) Inventors: Praveen Varma Nadimpalli, Chandler, AZ (US); Pradeep Charles Silva, San Diego, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/685,850

(22) Filed: Nov. 27, 2012

(65) Prior Publication Data

US 2013/0088286 A1 Apr. 11, 2013

Related U.S. Application Data

(63) Continuation of application No. 13/036,479, filed on Feb. 28, 2011, now Pat. No. 8,344,793.

(51) Int. Cl.
*G05F 1/10* (2006.01)
*G04F 3/02* (2006.01)

(52) U.S. Cl.
USPC ............ 327/540; 327/534; 327/637; 327/538

(58) Field of Classification Search
USPC ........... 327/52, 53, 58, 60, 62, 63, 65–69, 71, 327/72, 74, 77–81, 88, 89, 96, 127, 246, 327/266, 274, 280, 287, 359, 560–563, 100, 327/103, 530, 538–543, 546; 323/312–317
See application file for complete search history.

(56) References Cited

U.S. PATENT DOCUMENTS

| | | | | |
|---|---|---|---|---|
| 4,987,379 | A | * | 1/1991 | Hughes .......................... 330/253 |
| 5,774,013 | A | | 6/1998 | Groe |
| 6,346,848 | B1 | * | 2/2002 | Shkap ............................ 327/538 |
| 6,507,238 | B1 | * | 1/2003 | Yang .............................. 327/540 |
| 6,819,093 | B1 | | 11/2004 | Kay |
| 6,921,199 | B2 | | 7/2005 | Aota et al. |
| 7,521,975 | B2 | | 4/2009 | Biesterfeldt et al. |
| 7,576,610 | B2 | * | 8/2009 | Dalena .......................... 330/260 |
| 7,750,726 | B2 | * | 7/2010 | Fujisawa et al. .............. 327/538 |
| 7,940,036 | B2 | * | 5/2011 | Kamatani ...................... 323/312 |
| 2003/0137350 | A1 | * | 7/2003 | Yang .............................. 330/254 |
| 2005/0162218 | A1 | * | 7/2005 | Noda et al. .................... 327/541 |
| 2009/0002048 | A1 | | 1/2009 | Fujisawa et al. |
| 2010/0225384 | A1 | * | 9/2010 | Hirose et al. .................. 327/543 |
| 2011/0298497 | A1 | | 12/2011 | Nishijima et al. |

OTHER PUBLICATIONS

Notice of Allowance for U.S. Appl. No. 13/036,479 mailed Aug. 30, 2012, 7 pages.

* cited by examiner

*Primary Examiner* — Brandon S Cole
(74) *Attorney, Agent, or Firm* — Withrow & Terranova, P.L.L.C.

(57) ABSTRACT

A differential voltage controlled current source generating one or more output currents is based upon a single external resistor. The differential voltage controlled current source may generate an output current that is proportional to a received differential voltage and a bias current with the use of a single external resistor. The technique may be used to generate multiple accurate and process independent current sources. The current sources may be a zero temperature coefficient (ZTC) current, a proportional to absolute temperature (PTAT) current, or an inversely proportional to absolute temperature (NTAT) current. The output of the current sources may be inversely proportional to the resistance of the external resistor.

20 Claims, 3 Drawing Sheets a differential voltage controlled current source generating one
or more output currents based upon a single external resistor.
A differential voltage controlled current source may generate
multiple currents based upon a single external resistor. The
differential voltage controlled current source may generate an
output current that is proportional to a received differential
voltage and a bias current with the use of a single external
resistor. The technique may be used to generate multiple
accurate and process independent current sources. The current sources may be a zero temperature coefficient (ZTC)
current, a proportional to absolute temperature (PTAT) current, or an inversely proportional to absolute temperature
(NTAT) current. The output of the current sources may be
inversely proportional to the resistance of the external resistor.

The embodiments described in the detailed description
may further relate to a technique for generating multiple
accurate and process independent ZTC, PTAT, and NTAT
currents from a single external accurate resistor. For an exemplary n-type semiconductor, the external resistor is used to
generate a current that is inversely proportional to the product
of the mobility of an electron in an n-type semiconductor
material ($\mu_n$) and the capacitance of an oxide layer ($C_{ox}$) for a
metal on semiconductor transistor, $\mu_n C_{ox}$. The current that is
inversely proportional to $\mu_n C_{ox}$ biases a differential pair. As a
result, the transconductance, Gm, of the differential pair is a
constant. The constant Gm differential pair may then be
driven by one of a ZTC reference voltage, a PTAT reference
voltage, or an NTAT reference voltage. A subtractor circuit
may be used to subtract half of the bias current of the differential pair to yield one of a ZTC, PTAT, or NTAT current.

An exemplary embodiment of a semiconductor circuit configured to generate a current proportional to a differential
voltage includes a bias circuit coupled to a differential pair
circuit. A first bias current through the bias circuit is set by a
resistance of an external resistor. The bias circuit provides a
first bias voltage based upon the first bias current. The differential pair circuit includes a first leg corresponding to a first
voltage input and having a first leg current, a second leg
corresponding to a second voltage input and having a second
leg current, and a current source. The current source of the
differential pair circuit provides a second bias current to the
differential pair circuit based upon the first bias voltage. The
current subtractor circuit is coupled to the second leg of the
differential pair circuit and the bias circuit. The current subtractor circuit may be configured to generate a load current in
the output diode load substantially equal to the second leg
current minus one-half of the second bias current. An output
current source is coupled to the output diode load and configured to mirror the load current. The output current source
may generate an output current that is proportional to a voltage difference between the second voltage input and the first
voltage input.

Another exemplary integrated circuit includes a bias circuit
configured to generate a first bias current referenced to a
resistance, R, of an external resistor. A first transistor and a
second transistor may be configured to form a differential pair
circuit, where the differential pair circuit includes a second
bias current source configured to mirror the first bias current
to generate a second bias current. The first transistor of the
differential pair receives a first input voltage. The second
transistor of the differential pair receives a second input voltage. A third transistor is configured to mirror the drain current
of the second transistor. A fourth transistor is coupled to the
third transistor and configured to have a drain current substantially equal to one-half of the second bias current. A fifth
transistor is coupled to the third transistor and fourth transistor, where the fifth transistor is configured to have a drain
current substantially equal to a difference between the drain
current of the third transistor and the drain current of the
fourth transistor. A sixth transistor is configured to mirror the
drain current of the fifth transistor, where a drain current of
the sixth transistor is proportional to a difference between the
first input voltage and the second input voltage divided by the
resistance, R, of the external resistor.

Another exemplary embodiment of a semiconductor circuit configured to generate a current proportional to a differential voltage includes a bias circuit, a differential pair circuit,
a current subtractor and an output current source. A first bias
current through the bias circuit is set by a resistance of an
external resistor. The bias circuit provides a first bias voltage
based upon the first bias current. The differential pair circuit
may include a first leg corresponding to a first voltage input
and have a first leg current, a second leg corresponding to a second voltage input and have a second leg current, and a current source. The current source may provide a second bias current to the differential pair circuit based upon the first bias voltage. The current subtractor circuit may include an output diode load, where the current subtractor circuit is coupled to the second leg of the differential pair circuit and the bias circuit. The current subtractor circuit may be configured to generate a load current in the output diode load substantially equal to the first leg current less one-half of the second bias current. The output current source may be configured to mirror the load current. The output current source may produce an output current that is proportional to a voltage difference between the second voltage input and the first voltage input.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments disclosed herein relate to a differential voltage controlled current source generating one or more output currents based upon a single external resistor. A differential voltage controlled current source may generate multiple currents based upon a single external resistor. The differential voltage controlled current source may generate an output current that is proportional to a received differential voltage and a bias current with the use of a single external resistor. The technique may be used to generate multiple accurate and process independent current sources. The current sources may be a ZTC current, a PTAT current, or an NTAT current. The output of the current sources maybe inversely proportional to the resistance of the external resistor.

The embodiments described in the detailed description may further relate to a technique for generating multiple accurate and process independent zero temperature coefficient (ZTC), proportional to absolute temperature (PTAT), and inversely proportional to absolute temperature (NTAT) currents from a single external accurate resistor. For an exemplary n-type semiconductor, the external resistor is used to generate a current that is inversely proportional to the product of the mobility of an electron in an n-type semiconductor material ($\mu_n$) and the capacitance of an oxide layer ($C_{ox}$) for a metal on semiconductor transistor, $\mu_n C_{ox}$. The current that is inversely proportional to $\mu_n C_{ox}$ biases a differential pair. As a result, the transconductance, Gm, of the differential pair is a constant. The constant Gm differential pair may then be driven by one of a ZTC reference voltage, a PTAT reference voltage, or an NTAT reference voltage. A subtractor circuit may be used to subtract half of the bias current of the differential pair to yield one of a ZTC, PTAT, or NTAT current.

Figure 1:
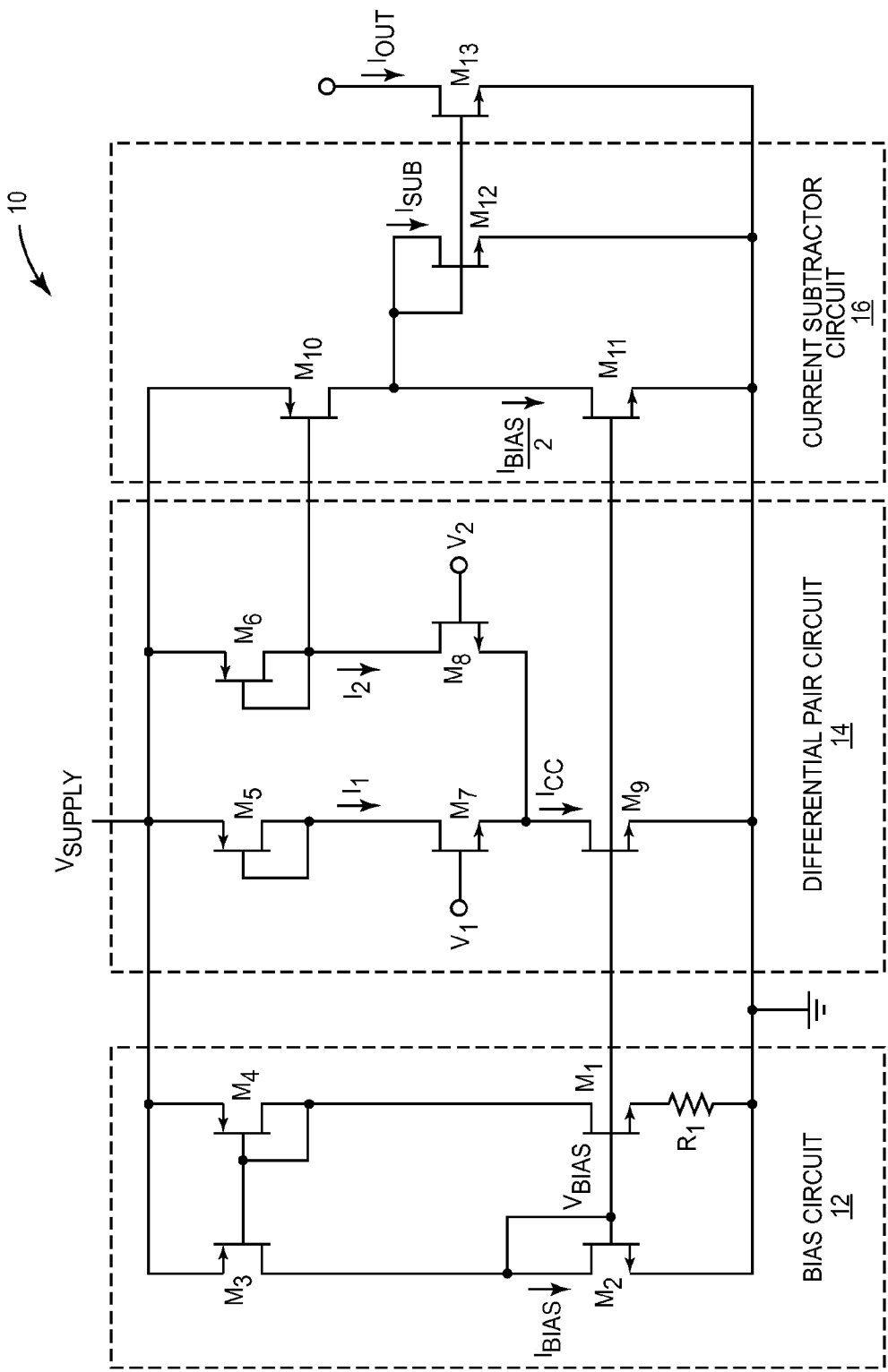
FIG. 1 depicts an exemplary embodiment of a differential voltage controlled current source referenced to one external resistor.

FIG. 1 depicts a block diagram of an exemplary embodiment of a semiconductor device current source circuit 10 that includes a differential voltage controlled current source referenced to a single external resistor, $R_1$. FIG. 1 depicts a bias circuit 12 formed by transistors $M_1$, $M_2$, $M_3$, $M_4$, and an external precision resistor $R_1$ with a resistance R. The transistors $M_4$ and $M_3$ may be configured as current sources to provide current to the transistors $M_2$ and $M_1$, respectively. The source of the transistor $M_4$ and the source of transistor $M_3$ are each coupled to a supply voltage, $V_{SUPPLY}$. The gates of the transistors $M_4$ and $M_3$ are coupled to the drain of transistor $M_4$ to form a first current mirror, where the current flowing through transistor $M_4$ is proportional to the current flowing through transistor $M_3$. The gate of transistor $M_1$ and the gate of transistor $M_2$ are coupled to the drain of transistor $M_2$ to form a second current mirror. The current through transistor $M_2$ is proportional to the current flowing through transistor $M_1$. The drain of transistor $M_3$ is coupled to the drain and gate of transistor $M_2$, which configures transistor $M_2$ to be a diode load that carries a bias current, $I_{BIAS}$. The source of transistor $M_2$ is coupled to ground. The drain of transistor $M_1$ is coupled to the drain of transistor $M_4$. The source of $M_1$ is coupled to resistor $R_1$. The current flowing through the resistor $R_1$, combined with the gate to source voltage of transistor $M_1$, provides a gate bias voltage, $V_{BIAS}$, on the gates of transistors $M_1$ and $M_2$. The bias current, $I_{BIAS}$, generated through the transistor $M_2$ by the bias circuit, is given by equation (1).

$$I_{BIAS} = \frac{2}{\mu_n C_{ox} R^2} \left( \frac{1}{\sqrt{\left(\frac{w}{L}\right)_2}} - \frac{1}{\sqrt{\left(\frac{w}{L}\right)_1}} \right)^2 \quad (1)$$

where $(w/L)_1$ is the ratio of the channel width to the channel length of the transistor $M_1$, and $(w/L)_2$ is the ratio of the channel width to the channel length of the transistor $M_2$.

FIG. 1 further depicts a differential pair circuit 14 including transistors $M_5$, $M_6$, $M_7$, $M_8$, and $M_9$. The differential pair circuit 14 includes a first leg, formed by the transistors $M_5$ and $M_7$, and a second leg, formed by the transistors $M_6$ and $M_8$. The sources of transistors $M_5$ and $M_6$ are each coupled to the supply voltage, $V_{SUPPLY}$. The gate of transistor $M_5$ is coupled to the drain of transistor $M_5$ to form a diode current source for transistor $M_7$, which provides a first current, $I_1$, to the drain of transistor $M_7$. The gate of transistor $M_6$ is coupled to the drain of transistor $M_6$ to form a diode current source, which provides a second current, $I_2$, to the drain of transistor $M_8$. A bias current, $I_{CC}$, for the differential pair circuit is developed by coupling the gate of the transistor $M_9$ to the bias voltage, $V_{BIAS}$, at the gate of transistor $M_2$. The current flowing through transistor $M_9$ will be proportional to the bias current, $I_{BIAS}$, passing through transistor $M_2$. The differential pair circuit includes a first input voltage, $V_1$, at the gate of transistor $M_7$ and a second input voltage, $V_2$, at the gate of transistor $M_8$.

The large signal transconductance of the transistor $M_7$, $Gm_1$, and the large signal transconductance of the transistor $M_8$, $Gm_2$, in the differential pair circuit 14 is described in equation (2). The drain current $I_{d1}$ corresponds to the current flowing through the drain of the transistor $M_7$. The drain current $I_{d2}$ corresponds to the current flowing through the transistor $M_8$. The ratio of channel width to channel length of transistors $M_7$ and $M_8$, (W/L), are the same. Because $\mu_n C_{ox}$ varies with temperature and process, the transconductances $Gm_1$ and $Gm_2$ of the differential pair circuit 14 may vary with process and temperature, as shown in equation (2).

$$Gm_1 = \sqrt{2I_{d1}\mu_n C_{ox}\left(\frac{W}{L}\right)} \qquad (2)$$

$$Gm_2 = \sqrt{2I_{d2}\mu_n C_{ox}\left(\frac{W}{L}\right)}$$

However, the process and temperature variations of $Gm_1$ and $Gm_2$ may be made constant over process and temperature by configuring the transistor $M_9$ to mirror the current $I_{BIAS}$ passing through transistor $M_2$. Accordingly, the transconductance, Gm, of the differential pair circuit 14 with the constant current source, $I_{CC}$, set equal to the current $I_{BIAS}$ is given by equation (3).

$$Gm_i = \sqrt{\frac{2}{R^2}\left(\frac{W}{L}\right)\left(\frac{1}{\sqrt{\left(\frac{W}{L}\right)_2}} - \frac{1}{\sqrt{\left(\frac{W}{L}\right)_1}}\right)^2} \qquad (3)$$

where Gm, is proportional to 1/R, as shown in equation (3.a).

$$Gm_i = \frac{1}{R}\sqrt{2\left(\frac{W}{L}\right)\left(\frac{1}{\sqrt{\left(\frac{W}{L}\right)_2}} - \frac{1}{\sqrt{\left(\frac{W}{L}\right)_1}}\right)^2} \qquad (3.a)$$

Ignoring channel length/mobility modulation, when $V_1 = V_2$, the drain currents, $I_{d1}$ and $I_{d2}$, in transistors $M_7$ and $M_8$, respectively, are equal and given by equation (4).

$$I_{d1} = I_{d2} = \frac{\mu_n C_{ox}}{2}\left(\frac{W}{L}\right)(V_{gs_i} - V_t)^2 \qquad (4)$$

where $Vgs_i$ is the gate to source voltage of transistors $M_7$ and $M_8$, $V_t$ is the threshold voltage of transistors $M_7$ and $M_8$, and (W/L) is the channel width to channel length ratio of transistors $M_7$ and $M_8$.

By substitution, if $V_2 > V_1$, the gate to source voltages of the transistors $M_7$ and $M_8$ are $V_{gs2}$ and $V_{gs1}$, respectively. The change in drain current through transistors $M_7$ and $M_8$ is given by equations (5), (6), respectively.

$$\Delta I_{d1} = G_m(V_{gs} - V_{gs1})\left[1 + \frac{(V_{gs1} - V_{gs})}{2V_{dsat}}\right] \qquad (5)$$

$$\Delta I_{d2} = G_m(V_{gs2} - V_{gs})\left[1 + \frac{(V_{gs2} - V_{gs})}{2V_{dsat}}\right] \qquad (6)$$

where $$V_{dsat_i} = \sqrt{\frac{2I_{d_i}}{\mu_n C_{ox}}\left(\frac{L}{W}\right)} \qquad (7)$$

Assuming that $V_{dsat}$ is very large relative to $(2V_{gs} - V_{gs2} - V_{gs1})$, the difference of the currents in $M_6$ and $M_7$ is given by equation (8).

$$\Delta I_d = \Delta I_{d1} + \Delta I_{d2} \qquad (8)$$
$$= G_m(V_{gs2} - V_{gs1})$$
$$= G_m(V_2 - V_1)$$

With $V_{dsat} \gg (2V_{gs} - V_{gs2} - V_{gs1})$

Accordingly, the current $I_2$ through transistor Mg is given by equation (9).

$$I_2 = Gm\left(\frac{V_2 - V_1}{2}\right) + \frac{I_{BIAS}}{2} \qquad (9)$$

The current $I_1$ through transistor $M_7$ is given by equation (10).

$$I_1 = Gm\left(\frac{V_1 - V_2}{2}\right) + \frac{I_{BIAS}}{2} \qquad (10)$$

Transistors $M_{10}$, $M_{11}$, and $M_{12}$ form a current subtractor circuit 16 having an output current $I_{SUB}$, which passes through transistor $M_{12}$. The current passing through transistor $M_{11}$ is subtracted from the current passing through transistor $M_{10}$ to generate the output current, $I_{sub}$, where the transistor $M_{12}$ is configured as a load diode by coupling the gate of the transistor $M_{12}$ to the drain of the transistor $M_{12}$. The source of the transistor $M_{12}$ is coupled to ground.

The gate of transistor $M_{10}$ is coupled to the gate of transistor $M_6$. The source of transistor $M_{10}$ is coupled to the supply voltage, $V_{SUPPLY}$. The transistor $M_{10}$ is configured to mirror the current $I_2$, which passes through the drain of transistor $M_6$.

The gate of transistor $M_{11}$ is coupled to the gate of transistor $M_2$. The source of transistor $M_{11}$ is coupled to ground. The drain of transistor $M_{11}$ is coupled to the drain of the transistor $M_{10}$ and the drain of transistor $M_{12}$. The transistor $M_{11}$ is configured to mirror one-half of the current $I_{BIAS}$ passing through $M_2$. Accordingly, the current passing through the drain of transistor $M_{12}$, $I_{SUB}$, is equal to the difference of the drain current of transistor $M_{10}$ less the drain current of transistor $M_{11}$, as given by equation (11).

$$I_{SUB} = Gm\left(\frac{V_2 - V_1}{2}\right) \qquad (11)$$

The current passing through transistor $M_{12}$ may be mirrored by transistor $M_{13}$ to generate an output current, $I_{OUT}$, as shown in equation (12).

$$I_{OUT} = Gm\left(\frac{V_2 - V_1}{2}\right) \qquad (12)$$

Equation (12) may also be re-written in terms of equation (3(a)), as shown in equation (12.a), where $I_{OUT}$ is proportional to 1/R.

$$I_{OUT} = \frac{(V_2 - V_1)}{R} \sqrt{\left(\frac{1}{2}\right)\left(\frac{W}{L}\right)\left(\frac{1}{\sqrt{\left(\frac{w}{L}\right)_2}} - \frac{1}{\sqrt{\left(\frac{w}{L}\right)_1}}\right)^2} \quad (12.a)$$

Because Gm is process and temperature independent, the output current, $I_{OUT}$, passing through transistor $M_{13}$ is also process and temperature independent.

Figure 2:
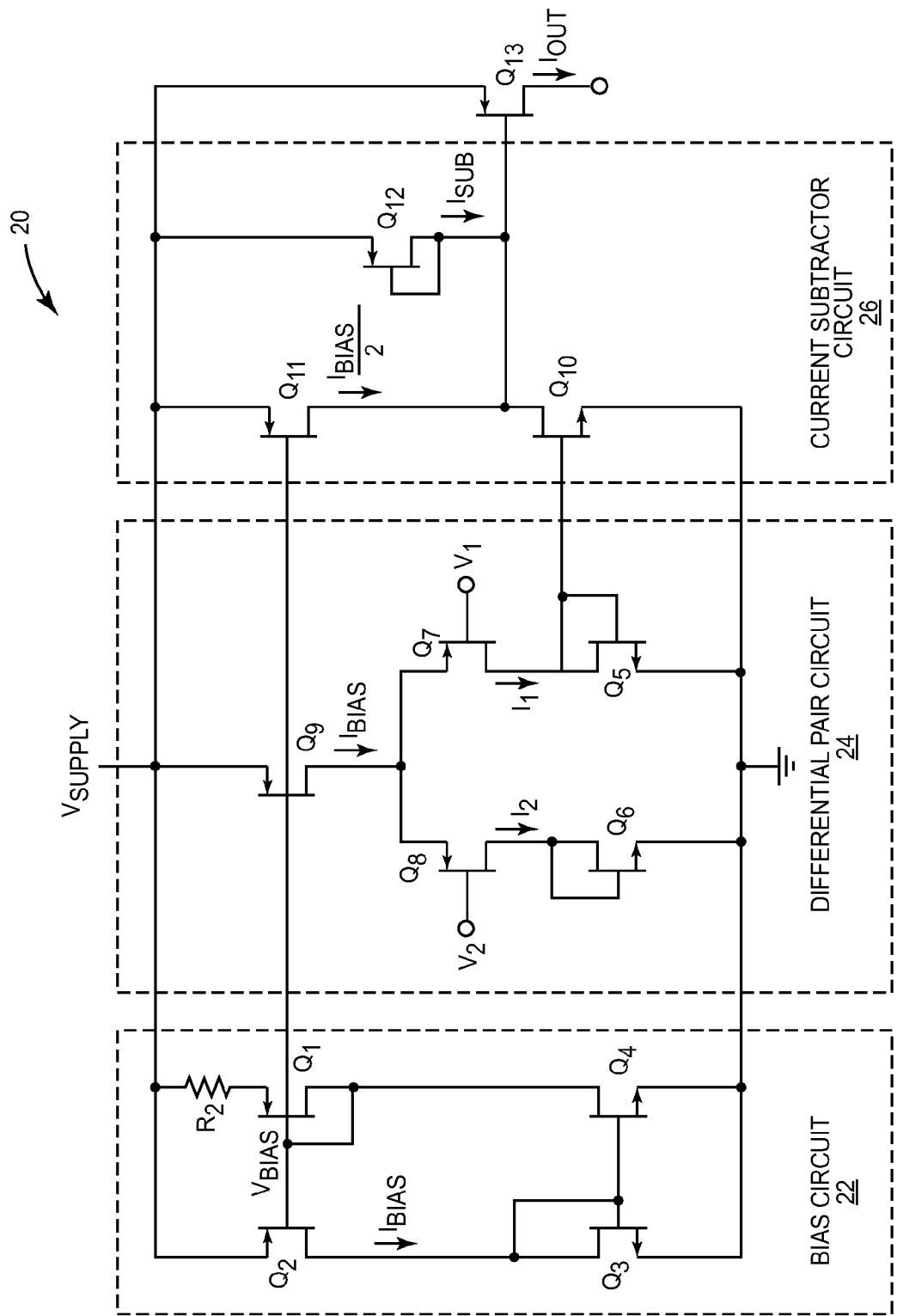
FIG. 2 depicts an exemplary current source circuit to provide multiple currents referenced to one external resistor.

FIG. 2 depicts an exemplary embodiment of a p-type doped semiconductor device current source circuit 20, which operates in a similar manner as the current source circuit 10.

The current source 20 includes a bias circuit 22, a differential pair circuit 24, and a current subtractor circuit 26. The bias current circuit 22 includes transistors $Q_1$, $Q_2$, $Q_3$, and $Q_4$ configured to generate a bias current, $I_{BIAS}$, through transistor $Q_2$. Similar to the bias circuit 12 of FIG. 1, the bias current $I_{BIAS}$ passing through transistor $Q_2$ is set based upon the resistance of an external resistor $R_2$, which generates a bias voltage, $V_{BIAS}$, at the gates of transistors $Q_1$ and $Q_2$. The transistors $Q_3$ and $Q_4$ are configured as current sources that are coupled to transistors $Q_2$ and $Q_1$, respectively. The gate of the transistor $Q_3$ is coupled to the drain of the transistor $Q_3$ and the gate of the transistor $Q_4$. The sources of the transistors $Q_3$ and $Q_4$ are coupled to ground. The drain of the transistor $Q_3$ is coupled to the drain of the transistor $Q_2$. The source of the transistor $Q_2$ is coupled to the supply voltage, $V_{SUPPLY}$. The gates of the transistors $Q_1$ and $Q_2$ are both coupled to the drain of the transistor $Q_1$. The source of the transistor $Q_1$ is coupled to an external resistor $R_2$, which has a resistance R. Thus, similar to the bias circuit 10 of FIG. 1, the transistor $Q_2$ of FIG. 2 is configured to pass the bias current, $I_{BIAS}$, as a function of the resistance, R, of the external resistor $R_2$, as shown in equation (13).

$$I_{BIAS} = \frac{2}{\mu_p C_{ox} R^2} \left(\frac{1}{\sqrt{\left(\frac{w}{L}\right)_2}} - \frac{1}{\sqrt{\left(\frac{w}{L}\right)_1}}\right)^2 \quad (13)$$

where $(w/L)_1$ is the ratio of the channel width to the channel length of the transistor $Q_1$, where $(w/L)_2$ is the ratio of the channel width to the channel length of the transistor $Q_2$, and R is the resistance of the external resistor $R_2$.

Similar to the differential pair circuit 14 of FIG. 1, the differential pair circuit 24 of FIG. 2 includes a first leg and a second leg coupled to a constant current source formed by the transistor $Q_9$. The gate of the transistor $Q_9$ is coupled to the gates of the transistors $Q_1$ and $Q_2$. The source of the transistor $Q_9$ is coupled to the supply voltage, $V_{SUPPLY}$. As a result, the current passing through the drain of the transistor $Q_9$ mirrors the current passing through the transistor $Q_2$.

The first leg of the differential pair includes transistors $Q_5$ and $Q_7$. The gate of transistor $Q_5$ is coupled to the drain of transistor $Q_5$. The source of the transistor $Q_5$ is coupled to ground. The drain of transistor $Q_7$ is coupled to the drain of $Q_5$, where the drain current of the transistor $Q_7$ is $I_1$. The source of the transistor $Q_7$ is coupled to the source of the transistor $Q_8$ and the drain of the transistor $Q_9$. Similarly, the second leg of the differential pair includes transistors $Q_6$ and $Q_8$. The gate of the transistor $Q_6$ is coupled to the drain of the transistor $Q_6$. The source of the transistor $Q_6$ is coupled to ground. The drain of the transistor $Q_6$ is coupled to the drain of the transistor $Q_8$, wherein the drain current of transistor $Q_8$ is $I_2$. The source of the transistor $Q_8$ is coupled to the source of the transistor $Q_7$ and the drain of the transistor $Q_9$. The differential pair circuit includes a first input voltage, $V_1$, at the gate of transistor $Q_7$ and a second input voltage, $V_2$, at the gate of transistor $Q_8$. Similar to the differential pair circuit 14 of FIG. 1, the differential pair circuit 24 of FIG. 2 is configured such that the current $I_1$ passing through the drain of the transistor $Q_7$ is given by equation (14).

$$I_1 = Gm\left(\frac{V_1 - V_2}{2}\right) + \frac{I_{BIAS}}{2} \quad (14)$$

where the transconductance, Gm, of the differential pair circuit 24 with the bias current set equal to the $I_{BIAS}$ is given by equation (15).

$$Gm = \frac{1}{R} \sqrt{2\left(\frac{W}{L}\right)\left(\frac{1}{\sqrt{\left(\frac{w}{L}\right)_2}} - \frac{1}{\sqrt{\left(\frac{w}{L}\right)_1}}\right)^2}$$

where (W/L) is the ratio of the channel width to channel length of the transistors $Q_7$ and $Q_8$, where $(w/L)_2$ is the ratio of the channel width to channel length of transistor $Q_2$, and where $(w/L)_1$ is the ratio of channel width to channel length of the transistor $Q_1$.

Similar to the current subtractor circuitry 16 of FIG. 1, the current subtractor circuitry 26 of FIG. 2 includes a transistor $Q_{11}$ configured to mirror the current of the transistor $Q_2$, where the transistor $Q_{11}$ is configured to pass a drain current of $I_{BIAS}/2$. The drain of the transistor $Q_{11}$ is coupled to the drain of the transistor $Q_{10}$, which is configured to mirror the current passing through the transistor $Q_5$. Accordingly, the current $I_{SUB}$ passing through the drain of transistor $Q_{12}$ is equal to the difference of the drain current of transistor $Q_{11}$ less the drain current of transistor $Q_{10}$, as given by equation (16).

$$I_{SUB} = Gm\left(\frac{V_2 - V_1}{2}\right) \quad (16)$$

The transistor $Q_{13}$ is coupled to the gate and drain of the transistor $Q_{12}$. The source of the transistor $Q_{13}$ is coupled to $V_{SUPPLY}$. As a result, the current passing through transistor $Q_{12}$ may be mirrored by transistor $Q_{13}$ to generate an output current, $I_{OUT}$, that is proportional to the current passing through the transistor $Q_{12}$, $I_{SUB}$, as shown in equation (17).

$$I_{OUT} = Gm\left(\frac{V_2 - V_1}{2}\right) \quad (17)$$

Similar to the current source circuit 10 of FIG. 1, because Gm is process and temperature independent, the output current, $I_{OUT}$, passing through transistor $Q_{13}$ is also process and temperature independent.

Figure 3:
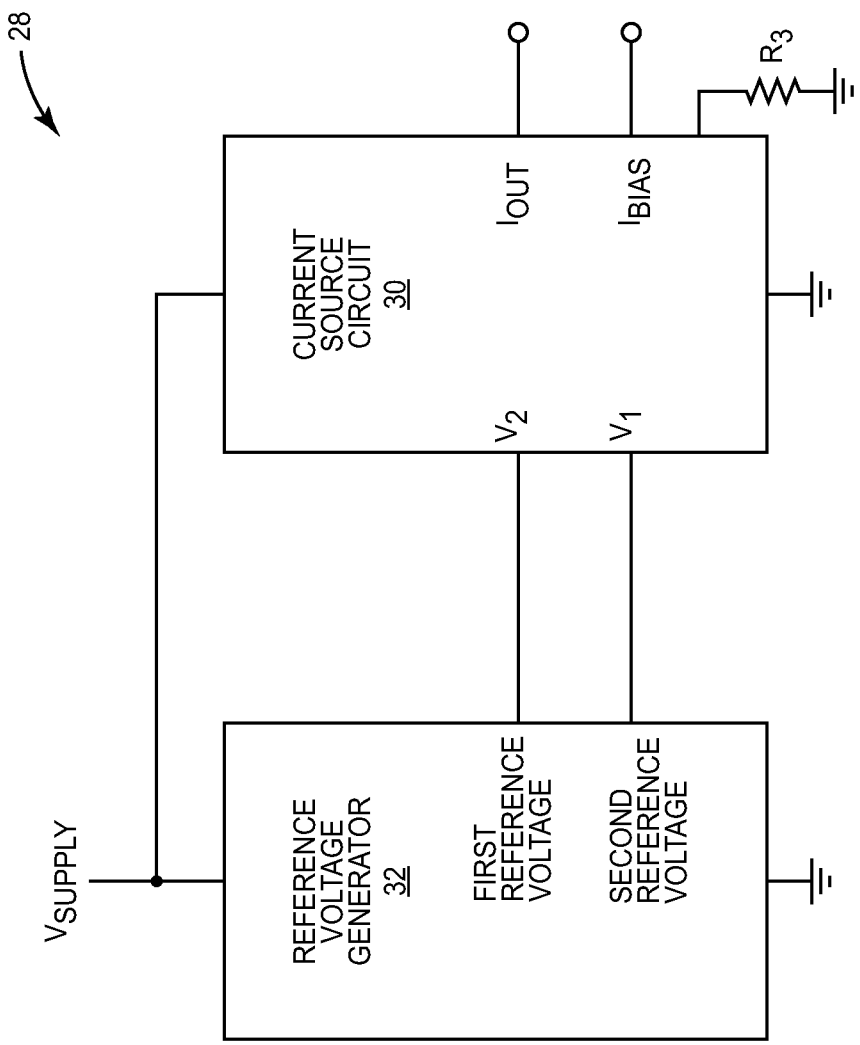
FIG. 3 depicts an exemplary embodiment of a differential voltage controlled current source referenced to one external resistor.

FIG. 3 depicts an implementation of a current source generator 28 having a current source circuit 30. The current source circuit 30 may be implemented in either NMOS or PMOS, which correspond to the current source circuit 10 of FIG. 1 and the current source circuit 20 of FIG. 2, respectively. The current source circuit 30 functions and operates in a similar manner as the current source circuit 10 and the current source circuit 20, as described above, where the output current is given by equations (18) and (18.a).

$$I_{OUT} = Gm\left(\frac{V_2 - V_1}{2}\right) \quad (18)$$

and $$I_{OUT} = \frac{(V_2 - V_1)}{R}\sqrt{\left(\frac{1}{2}\right)\left(\frac{W}{L}\right)\left(\frac{1}{\sqrt{\left(\frac{w}{L}\right)_2}} - \frac{1}{\sqrt{\left(\frac{w}{L}\right)_1}}\right)^2} \quad (18.a)$$

Similar to the current source circuit 10 of FIG. 1 and the current source circuit 20 of FIG. 20, the current source circuit 30 may include an output of a bias current, $I_{BIAS}$, which may be provided as an output by mirroring the current passing through the transistor $M_2$ of FIG. 1 or the transistor $Q_2$ of FIG. 2, as depicted in FIG. 3.

The current source circuit 30 may include an external resistor port for receiving an external precision resistor $R_3$ that sets the bias current, $I_{BIAS}$, of the current source circuit 30. The current source generator 28 may include a reference voltage generator 32. The reference voltage generator 32 may include a first reference voltage output, $V_{OUT}$, and a second reference voltage output, $V_{REF}$, where the first reference voltage output, $V_{OUT}$, is greater than the second reference voltage output, $V_{REF}$. The first reference voltage output, $V_{OUT}$, of the reference voltage generator 32 may be coupled to the second input voltage, $V_2$, of the current source circuit 30. The second reference voltage output, $V_{REF}$, of the reference voltage generator 32 may be coupled to the first input voltage, $V_1$ of the current source circuit 30.

The reference voltage generator 32 may generate various differential voltages depending upon the needs of a particular semiconductor circuit. As an example, the reference voltage generator 32 may be a band gap circuit, which provides a constant voltage over the temperature of the band gap circuit. Because the output current, $I_{OUT}$, of the current source circuit 30 is proportional to the second input voltage, $V_2$, less the first input voltage, $V_1$, the output current $I_{OUT}$, will maintain a constant value over temperature and process variations. In addition, the output current, $I_{OUT}$, of the current source circuit 10 will be referenced back to the resistance, R, of the external precision resistor $R_3$.

As another example, the current source generator 30 may be configured to produce a proportional to absolute temperature current, $I_{PTAT}$, by using a PTAT voltage circuit as the second reference voltage of the reference voltage generator 32, where the output current, $I_{OUT}$, is referenced back to the resistance, R, of the external precision resistor $R_3$.

As another example, the current source circuit 30 may be used to generate an inversely proportional to absolute temperature current, $I_{NTAT}$, by using a NTAT voltage circuit as the voltage reference circuit 32, where the output current, $I_{OUT}$, is referenced back to the resistance, R, of the external precision resistor $R_1$.

In addition, the $I_{BIAS}$ current may be provided as a second current output by mirroring the current passing through transistor $M_2$ of FIG. 1.

Those skilled in the art will recognize improvements and modifications to the embodiments of the present disclosure. All such improvements and modifications are considered within the scope of the concepts disclosed herein and the claims that follow.

What is claimed is:

1. A semiconductor circuit configured to generate a current proportional to a differential voltage comprising:
   a bias circuit configured to generate a bias voltage;
   a differential pair circuit having a leg and being operable to receive a first voltage input and a second voltage input, wherein the differential pair circuit is configured to generate a bias current based on the bias voltage and the leg is configured to generate a leg current;
   a current subtractor circuit coupled to the differential pair circuit and the bias circuit wherein the current subtractor circuit is configured to generate a load current substantially equal to the leg current minus a proportion of the bias current;
   an output current source configured to mirror the load current, wherein the output current source produces an output current that is proportional to a voltage difference between the first voltage input and the second voltage input.

2. The semiconductor circuit of claim 1 wherein the proportion of the bias current is one-half.

3. The semiconductor circuit of claim 1 further comprising a band gap voltage circuit electrically coupled to the differential pair circuit, wherein the band gap voltage circuit is configured to provide a differential voltage output across the first voltage input and the second voltage input of the differential pair circuit; and
   wherein the output current source is substantially constant with respect to temperature over a temperature range of the band gap voltage circuit.

4. The semiconductor circuit of claim 1 further comprising a proportional to absolute temperature voltage source circuit, wherein the proportional to absolute temperature voltage source circuit provides a differential voltage output across the first voltage input and the second voltage input of the differential pair circuit.

5. The semiconductor circuit of claim 1 further comprising a proportional to absolute temperature voltage source circuit, wherein the proportional to absolute temperature voltage source circuit provides a differential voltage output across the first voltage input and the second voltage input of the differential pair circuit, and wherein the output current source is a proportional to absolute temperature current source over a temperature range of the proportional to absolute temperature voltage source circuit.

6. The semiconductor circuit of claim 1 further comprising an inversely proportional to absolute temperature voltage source circuit, wherein the inversely proportional to absolute temperature voltage source circuit provides a differential voltage output across the first voltage input and the second voltage input of the differential pair circuit, and wherein the output current source is a proportional to absolute temperature current source over a temperature range of the proportional to absolute temperature voltage circuit.

7. The semiconductor circuit of claim 1 wherein the semiconductor circuit is implemented in an NMOS process.

8. The semiconductor circuit of claim 1 wherein the output current is proportional to the voltage difference between the second voltage input and the first voltage input divided by a resistance of a resistor.

9. The semiconductor circuit of claim 1 wherein the differential pair circuit includes a large signal transconductance, wherein the large signal transconductance is inversely proportional to a resistance of a resistor.

10. The semiconductor circuit of claim 1 further comprising a reference voltage generator including a first reference voltage output and a second reference voltage output;
wherein the first reference voltage output is coupled to the first voltage input and the second reference voltage output is coupled to the second voltage input.

11. An integrated circuit comprising:
a bias circuit configured to generate a first bias current set by a resistance;
a first transistor and a second transistor configured to form a differential pair circuit, wherein the first transistor receives a first input voltage and the second transistor receives a second input voltage and the differential pair circuit is configured to mirror the first bias current to generate a second bias current;
a third transistor having a drain current, wherein the third transistor is configured to mirror a drain current of the second transistor;
a fourth transistor coupled to the third transistor, the fourth transistor configured to mirror the second bias current, wherein the fourth transistor is configured to have a drain current substantially equal to a proportion of the second bias current;
a fifth transistor coupled to the third transistor and the fourth transistor, wherein the fifth transistor is configured to have a drain current substantially equal to a difference between the drain current of the third transistor and the drain current of the fourth transistor; and
a sixth transistor configured to mirror the drain current of the fifth transistor, wherein a drain current of the sixth transistor is proportional to a difference between the first input voltage and the second input voltage divided by the resistance.

12. The integrated circuit of claim 11 wherein the drain current of the sixth transistor is proportional to the drain current of the fifth transistor.

13. The integrated circuit of claim 11 wherein the second bias current is substantially equal to the first bias current.

14. The integrated circuit of claim 11 wherein a resistor having the resistance is external to the integrated circuit.

15. The integrated circuit of claim 11 wherein the proportion is equal to one-half.

16. A semiconductor circuit configured to generate a current proportional to a differential voltage comprising:
a bias circuit configured to generate a first bias current set by a resistance;
a differential pair circuit operable to receive a first voltage input and a second voltage input and having a leg, wherein the differential pair circuit is configured to mirror the first bias current to generate a second bias current and the leg is configured to generate a leg current;
a current subtractor circuit including an output diode load, wherein the current subtractor circuit is coupled to a second leg of the differential pair circuit and the bias circuit, and wherein the current subtractor circuit is configured to generate a load current substantially equal to the leg current minus a proportion of the second bias current;
an output current source configured to mirror the load current, wherein the output current source produces an output current that is proportional to a voltage difference between the second voltage input and the first voltage input.

17. The semiconductor circuit of claim 16 wherein the output current is a first output current, and further including a current mirror coupled to the bias circuit, wherein the current mirror is configured to mirror the first bias current to generate a second output current.

18. The semiconductor circuit of claim 16 further comprising a band gap voltage circuit electrically coupled to the differential pair circuit, wherein the band gap voltage circuit is configured to provide a differential voltage output across the first voltage input and the second voltage input of the differential pair circuit; and
wherein the output current source is substantially constant with respect to temperature over a temperature range of the band gap voltage circuit.

19. The semiconductor circuit of claim 16 wherein the semiconductor circuit is implemented in a PMOS process.

20. The semiconductor circuit of claim 16 wherein the proportion is equal to one-half.

* * * * *